US006032419A

United States Patent [19]

Hurwitt

[11] Patent Number: 6,032,419

[45] Date of Patent: Mar. 7, 2000

[54] VACUUM PROCESSING APPARATUS WITH LOW PARTICLE GENERATING VACUUM SEAL

[75] Inventor: Steven D. Hurwitt, deceased, late of Park Ridge, N.J., by Anne M. Hurwitt, executrix

[73] Assignee: Tokyo Electron Limited, Japan

[21] Appl. No.: 08/838,383

[22] Filed: Apr. 8, 1997

[51] Int. Cl.[7] .......... E06B 7/16

[52] U.S. Cl. .......... 49/475.1; 137/1

[58] Field of Search .......... 49/475.1; 137/1, 137/487.5; 251/900; 384/152

[56] References Cited

U.S. PATENT DOCUMENTS

| | | | |
|---|---|---|---|
| 3,977,423 | 8/1976 | Clayton | 137/12 |
| 4,525,262 | 6/1985 | Class et al. | |
| 4,909,271 | 3/1990 | Canaan et al. | 137/240 |
| 4,991,619 | 2/1991 | Della Porta | 137/240 |
| 5,205,051 | 4/1993 | Hurwitt | |
| 5,226,632 | 7/1993 | Tepman et al. | 251/335.3 |
| 5,237,756 | 8/1993 | Hurwitt | |
| 5,363,872 | 11/1994 | Lorimer | |
| 5,589,041 | 12/1996 | Lantsman | |

FOREIGN PATENT DOCUMENTS 0735574 10/1996 European Pat. Off. .

*Primary Examiner*—Daniel P. Stodola
*Assistant Examiner*—Curtis A. Cohen
*Attorney, Agent, or Firm*—Wood, Herron & Evans, L.L.P.

[57] ABSTRACT

A wafer processing apparatus is provided with sealing ports between adjacent evacuatable chambers that are actuated to compress elastomeric seals carried by the valve sealing elements to differing degrees of compression, based on the amount of pressure differential between the chambers when sealed. The degree of compression is controlled so that less compression of the seal takes place when less is required to seal, such as with lower pressure differentials, thereby avoiding unnecessary fatigue and wear of and around the seals that would otherwise increase the generation of particulate contamination.

6 Claims, 2 Drawing Sheets

VACUUM PROCESSING APPARATUS WITH LOW PARTICLE GENERATING VACUUM SEAL

This invention relates to high vacuum processing and particularly to the avoidance of particulate contamination in applications such as semiconductor device manufacturing by reducing contamination originating from the cycling of vacuum seals.

BACKGROUND OF THE INVENTION

High vacuum systems are widely used in technical and commercial applications such as semiconductor device manufacturing processes, which require the performance of the particular process in the absence of air and airborne contaminants. An example of such a process is the sputter deposition of thin films onto silicon wafer substrates in the manufacture of integrated circuit chips.

In such applications, the high vacuum sputtering system is typically composed of a metal processing chamber, which contains a variety of flanges or ports for the attachment of components such as vacuum producing pumps, sputtering cathodes, measurement instrumentation, access covers and observation windows. Additionally, specific ports are usually provided for the frequent insertion and removal of the wafer or other object being processed.

In order to provide a seal between members which is vacuum tight and yet removable for access or for component maintenance, the most commonly used device is a commercially available elastomeric gasket known as an O-ring. The material of choice for such seals is a rubber-like fluorocarbon material manufactured by E. I. Dupont de Nemours Inc. under the trademark VITON A. This material combines the desirable properties of low out-gassing, low permeability and good compressibility over a useful temperature range.

Most components attached with elastomeric seals are removed infrequently. However, seal ports used for the insertion and removal of objects being processed may be opened and closed as frequently as twice per minute, for 24 hours per day. This type of use generates microscopic particles of both seal material and of adjacent metal surfaces. Such particles are of extreme concern as they can destroy integrated circuits or other devices on the substrate being processed, thus causing a costly reduction in manufacturing yield.

For example, in the case of frequently cycled sealing ports, where a transfer chamber is provided and maintained at a high vacuum of $10^{-7}$ torr, each time a substrate passes through a sealing port, that port is opened and then closed to isolate the environments between adjacent chambers, such as process chambers, a transfer chamber or load chambers.

The slit valve seal plate contains a sealing O-ring. The O-ring is totally compressed to provide a reliable vacuum seal against standard atmospheric pressure in the order of 14.7 pounds per square inch or 760 Torr, which is a pressure differential experienced between a transfer chamber and a loadlock chamber, or between a transfer chamber and a processing chamber when the processing chamber is occasionally opened to atmosphere for service. O-ring seals are also similarly compressed each time a wafer is transferred therethrough in the systems of the prior art when the pressure differential between adjacent chambers is significantly less than 760 Torr.

This compression of an O-ring produces microscopic particles which can be highly deleterious to the product being produced. These particles are produced in two ways.

Firstly, repeated compression of the O-ring to the degree necessary to form a reliable standard atmospheric pressure tends to fatigue the elastomer material of which the O-ring is made, causing minute failures which generate elastomer particles. Secondly, as the O-ring is compressed into groove, sliding friction occurs along side faces of groove. This friction abrades both the surface of the O-ring and side surfaces of the groove, producing particles of both elastomer and metal. This abrasion also occurs during decompression of the O-ring.

The presence of such particles in processes such as the manufacture of semiconductor devices results in a substantial loss of value and productivity. This is increasingly the case with the trend toward device miniaturization in which the presence of a sub-micron size particle on the surface of a substrate can result in the production of a totally defective device.

Accordingly, there is an increased need to reduce the quantity of contaminating particles in high vacuum processes, particularly in the manufacture of semiconductor devices.

SUMMARY OF THE INVENTION

It is an object of this invention to provide a high vacuum processing apparatus with the frequently cycled ports thereof seated in a way that reduces the levels of particle generation. It is a further object to provide a seat and sealing method that produces reduced levels of particulate contamination.

It is a more particular objective of the present invention to provide a sealing method for high vacuum processes in which O-ring compression is such as to effectively seal as well as reduce the production of particles thereby, particularly in accordance with the requirements of the system.

According to principles of the present invention, seal compression is provided to an extent that is sufficient to effectively provide the sealing function required, while excess compression that could increase the amount of particle generation is avoided. According to the preferred embodiment of the invention, different degrees of seal compression are brought about in accordance with system conditions that require different degrees of compression for an effective seal.

Further in accordance with the preferred embodiment of the invention, it is appreciated that there are two different conditions under which a port must seal in high vacuum processes. In the first condition, one or more of the various process chambers, the transfer chamber or loading chamber may be opened to atmosphere for purposes of maintenance or for the loading or unloading of substrate cassettes, while adjacent chambers are maintained at high vacuum. This is a relatively infrequent event, especially with respect to a transfer chamber and the process chambers where such maintenance may only occur, for example, once per week. In this condition, with full atmospheric pressure of 760 Torr on the port seal that isolates the process chamber from the transfer chamber, full compression of O-ring is provided to enable the port to hold the high vacuum against the standard atmospheric pressure and thereby prevent leakage. The second condition, occurs with every substrate processing cycle. In this condition, compression of the aperture O-ring is limited to only partial compression, providing effective sealing where the vacuum level in transfer chamber is, for example, about $10^{-7}$ torr and the pressure in processing chambers is, for example, $10^{-2}$ torr, which creates a pressure differential across the O-ring of, for example, about 1/76,000 of atmospheric pressure, which does not require full O-ring compression to provide a reliable seal.

Further in accordance with the preferred embodiments of the invention, actuation of valves between chambers in a high vacuum processing apparatus is controlled to limit compression of valve seals, particularly by compressing the seals less than the full amount of compression of which the seal is capable. Preferably, the compression of the seal is selectively controlled so that the seal can compress only the amount needed to be effective under conditions where less than the maximum possible pressure differential occur, and can compress a greater amount when higher pressure differentials require more seal compression to effectively provide a seal.

In one embodiment of the invention, the position of the valve closure is controlled so that the amount of valve compression can be maintained at a predetermined amount. In another embodiment, the force applied to the valve closure is controlled so that the force which deforms the valve seal is controlled so as to limit seal compression to the predetermined amount.

The present invention provides the capability of compressing valve seals only to the extent required to effectively provide a seal. This limits the amount of fatigue and abrasion to which the seal is subjected, thereby substantially reducing the amount of particle generation of elastomeric seal material and cooperating surfaces, thus reducing the production of defective devices and other processed products and increasing the overall productivity of the vacuum process.

These and other objectives of the present invention will be more readily apparent from the following detailed description of the invention, in which:

DETAILED DESCRIPTION OF THE PREFERRED EMBODIMENT

Figure 1:
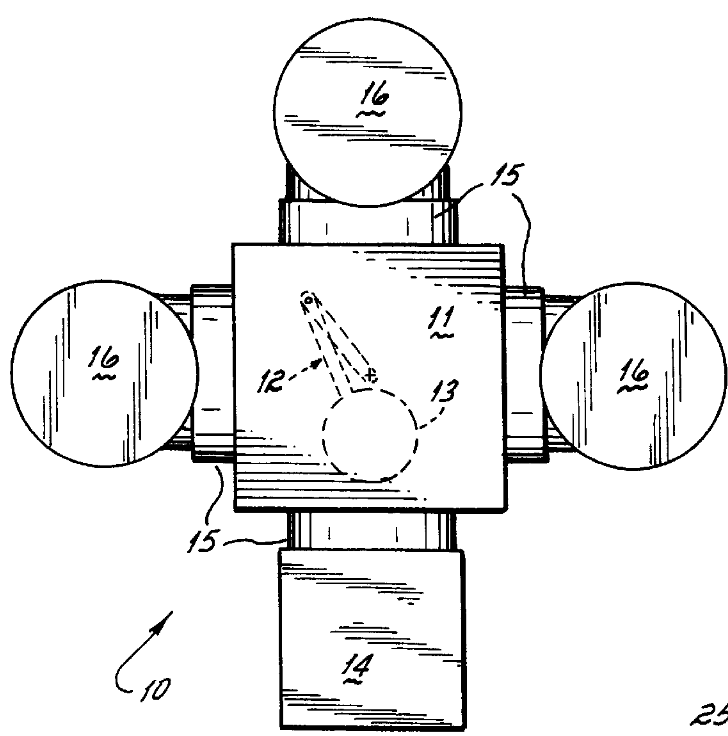
FIG. 1 is a top plan diagram of a semiconductor wafer processing machine.

An apparatus in which the present invention is particularly useful is apparatus 10, which is diagrammatically illustrated in FIG. 1. The apparatus 10 may include all of the typical elements of a semiconductor wafer processing cluster tool. In the apparatus 10, for example, a central transfer chamber II is provided, which is typically maintained at a high vacuum of $10^{-7}$ torr. The transfer chamber 11 contains a robot mechanism 12 such as an extendable transfer arm having a wafer chuck or holder (not shown) at an end thereof for holding thereto a wafer or other substrate 13. The system 10 also includes loading chamber 14 capable of enclosing a cassette (not shown) of substrates 13, and is connected to the transfer chamber 11 through a sealing port 15. One or more processing chambers 16 are also provided, which are similarly connected to the transfer chamber 11 through other sealing ports 15.

In operation, the robot arm 12 removes substrates 13 one-by-one from the loading chamber 14 and delivers them to, and transfers them among, any of one or more of the process chambers 16, and then returns them to loading chamber 14, according to the steps of the particular process. Each time a substrate 13 passes through a sealing port 15, that port 15 is opened and then closed to isolate the environments of process chambers 16, transfer chamber 11 and load chamber 14 from each other.

Figure 2:
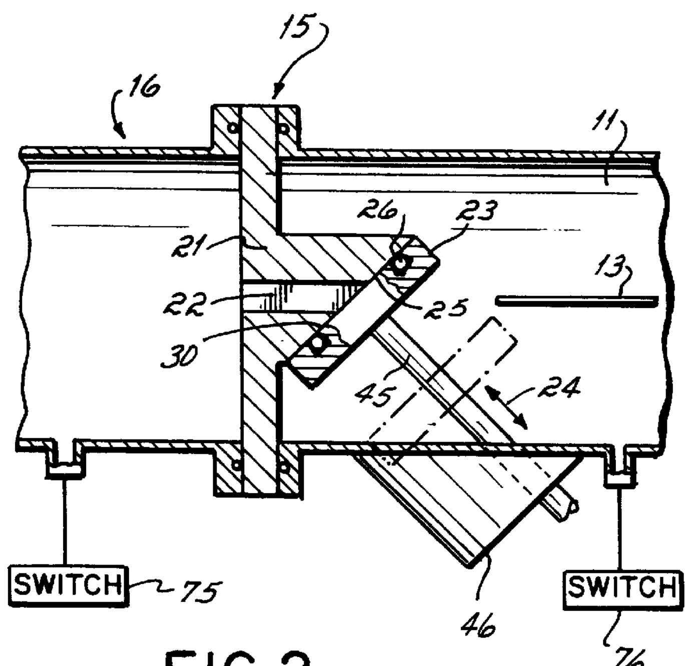
FIG. 2 is a cross-sectional diagram of a seal in an aperture and valve of the machine of FIG. 1.

FIG. 2 shows the construction of such a typical sealing port 15. Transfer chamber 11 is separated from process chambers 16 by wall 21, which contains an aperture or slit 22 through which a substrate 13 may pass. A seal plate 23 is provided, which is driven by a plate actuator mechanism such as a pneumatic cylinder (not shown) in the direction of arrow 24. When seal plate 23 engages surface 25 of wall 21 surrounding the slit 22, the process chamber 16 is isolated from transfer chamber 11. When seal plate 23 is momentarily retracted to the position illustrated in phantom lines in FIG. 2, out of the plane of the aperture 22 and the substrate 13, the substrate 13 may be passed through aperture 22.

Figure 3:
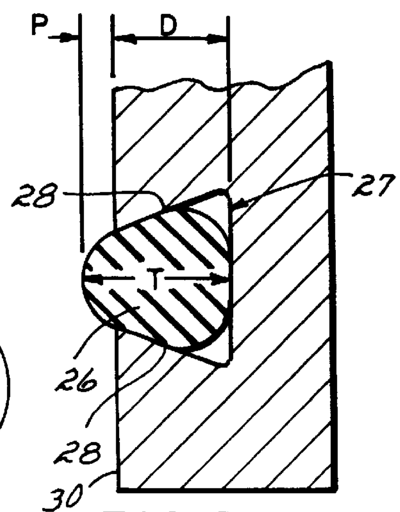
FIG. 3 is a cross-sectional diagram of a seal of the valve of FIG. 2 with the seal in an uncompressed condition.

Seal plate 23 will typically contain a sealing O-ring 26, shown in circled FIG. 2 and is illustrated in more detail in the enlarged view of FIG. 3., which shows the O-ring 26 in an uncompressed or relaxed position.

Referring to FIG. 3, O-ring 26 is shown installed in a groove 27 formed in seal plate 23. The groove 27 has sidewalls 28, one or both of which are angled inwards, typically at about 15°, in order to retain the O-ring 26 in the groove 27 during motion of plate 23. The depth D of groove 27 is about 75% of the relaxed section diameter or thickness T of the O-ring 26, leaving a projection P of about 25% of T above surface 30 of the plate 23. This dimension P represents the amount of compression of O-ring 26 that is available to form a seal, that is, to perform a sealing function between the plate 23 and the surface 25 surrounding the slit 22. For a typical sealing the O-ring 26, the dimension T may typically be 0.210 inches, the groove depth D may typically be 0.157 inches and the projection P may typically be 0.053 inches.

Figure 4:
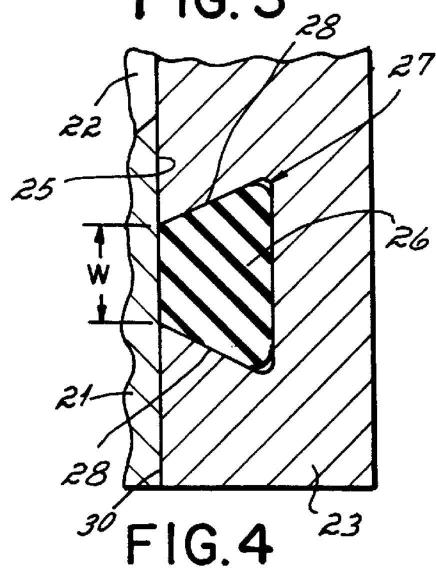
FIG. 4 is a cross-sectional diagram of a seal of the valve of FIG. 2 with a seal in a fully compressed condition.

FIG. 4 shows the same O-ring 26 with sealing surfaces engaged, that is, with surface 30 of plate 23 in contact with the surface 25. In this position, O-ring 26 is fully compressed within groove 27. For the typical O-ring dimensions given above, the width W of contact area between seal surface 25 and the compressed O-ring 26 is generally about 0.190 inches. This width of seal contact in conjunction with the force applied to compress the O-ring 26 provides a reliable vacuum seal against standard atmospheric pressure in the order of 760 Torr.

Figure 5:
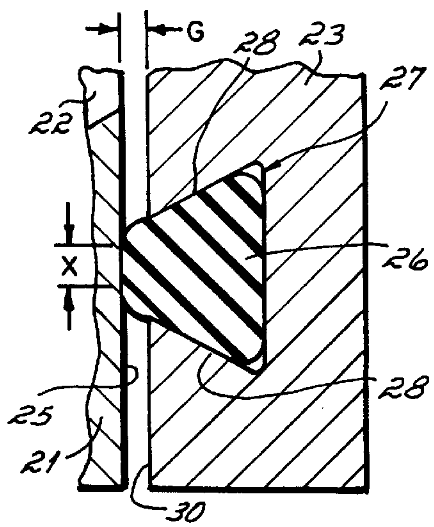
FIG. 5 is a cross-sectional diagram of a seal of the valve of FIG. 2 with a seal in a controlled partially compressed, particularly in accordance with principles of the present invention.

In accordance with principles of the present invention, apparatus 10 also includes a valve for closing sealing port 15 in which seal 26 can be partially compressed, as illustrated in FIG. 5, which shows the O-ring seal 26 compressed, but to a lesser degree than in FIG. 4. With O-ring 26 of 0.210 inches in cross-section and the groove depth D of 0.157 inches, but a compression of only 10% instead of 25% of the O-ring thickness T. a gap G of about 0.032 inches is provided between surface 30 of plate 23 and sealing surface 25. The width X of O-ring contact area with the surface 25 is about 0.060 inches. With a differential pressure of, for example, about 8 torr or less, this contact area width X and the force effective to achieve it are sufficient to for seal against such a reduced pressure differential. This limited compression of O-ring 26 produces less fatigue of the elastomer material than does the complete compression of FIG. 4, thereby reducing particle generation. Additionally, the reduced compression also reduces the sliding of O-ring 26 against groove side faces 28, thus reducing abrasion and the generation of both elastomer and metal particles.

Depending on the durometer (hardness) of the elastomer used, an O-ring of the dimensions referred to above generally requires about 35 pounds of force per linear inch to achieve a 25% compression, but only about 10 pounds of force per linear inch to achieve a 10% compression.

According to certain embodiments of the invention, valve actuation is controlled so that the limited seal compression in a predetermined amount is specifically provided. According to one preferred embodiment of the invention, a mechanical motion device 40 is employed move seal plate 23 to a pre-determined distance G from seal surface 25, thus allowing a pre-determined degree of compression, for example 10%, of O-ring 26. For full compression of the seal 26, surface 30 may be moved into engagement with surface 25. One embodiment of such a device is shown in FIG. 6.

Figure 6:
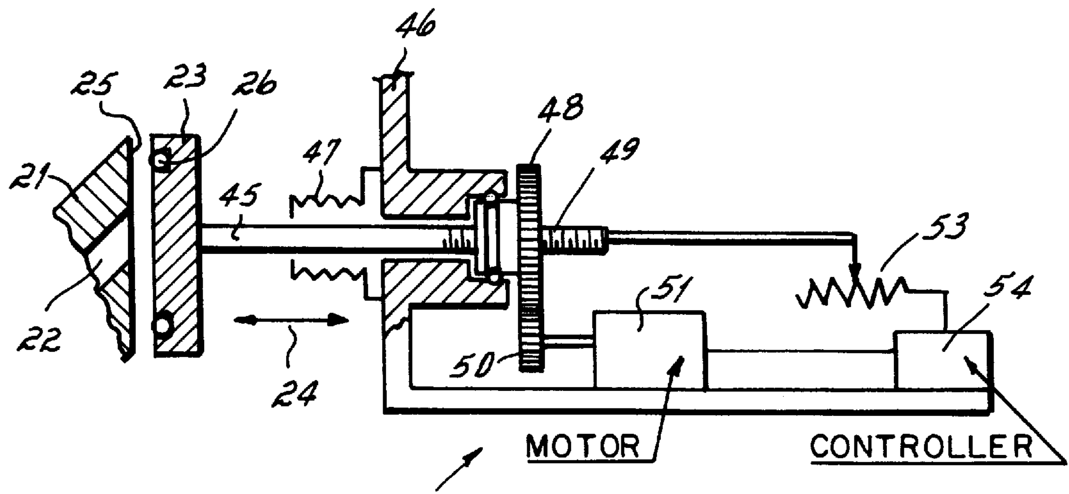
FIG. 6 is a diagrammatic illustration of a valve actuator for the valve of FIG. 2, according to the present invention, for operating the valve in a controlled manner among the conditions of FIGS. 3–5.

Referring to FIG. 6, seal plate 23, containing O-ring 26 is mounted to a drive shaft 45, which is flexibly sealed to opposing chamber wall 46 by a bellows 47. A drive gear 48 is provided with a threaded bore therethrough which engages a threaded portion 49 of shaft 45 so that rotation of gear 48 by a motor gear 50 on the shaft of a drive motor 51 fixed relative to the wall 46 causes linear motion of seal plate 23 in the direction of arrow 24 in FIG. 6. A position sensor 53 is provided, connected between the shaft 45 and a stationary reference such as the wall 46 is provided to measure and feedback to a controller 54 the actual position of the plate 23, so that, in response to the feedback from the sensor 53 and the predetermined position that corresponds to the gap G programmed in the controller 54, activates the motor 51 to move the plate 23 to bring its surface 30 to the distance G from the surface 25. In this manner, seal plate 23 may selectively be fully withdrawn to permit passage of a substrate through aperture 22, may be brought into engagement with surface 25 for a full compression seal, or may be positioned with a predetermined gap G to provide a low compression seal. The selection is made in accordance with the condition of the system, under the control of the controller 54, which may operate either in accordance with a predetermined sequence, or in response to sensors that sense machine condition or both.

Other control arrangements may also be utilized to achieve the objective of controlling the compression of seal 26 and the position of plate 23 with respect to surface 25 over the range of motion required to selectively provide the various degrees of compression of O-ring 26. For example, the compression of O-ring 26 may be controlled by controlling the force exerted on plate 23 rather than sensing and controlling its distance from surface 25. Using, for example, O-ring 26 described above, wherein a force of 35 pounds per linear inch of seal 26 produces a 25% compression and a force of 10 pounds per linear inch produces a 10% compression, with an O-ring having a total length of 20 inches, a total force of 700 pounds will provide 25% compression and a total force of 200 pounds will provide 10% compression.

Figure 7:
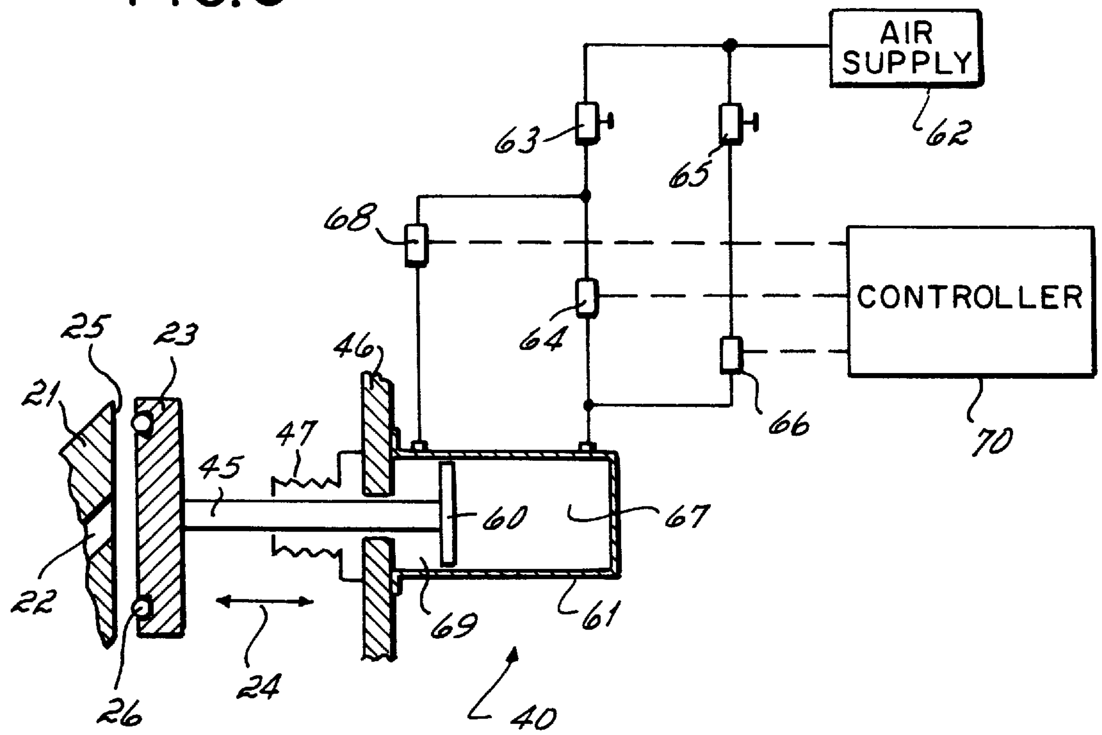
FIG. 7 is a diagrammatic illustration, similar to FIG. 6, showing an altertive actuator for operating the valve in a controlled manner among the conditions of FIGS. 3–5.

The embodiment illustrated in FIG. 7 is one embodiment of a variable force controlled system, wherein seal plate 23 is connected by shaft 45 a to sliding piston 60 of a pneumatic cylinder 61. The cylinder 61 is connected to compressed air supply 62 through high pressure regulator 63 and valve 64 and through low pressure regulator 65 and valve 66. High pressure regulator 63 is adjusted to a pressure that produces a force of at least 700 pounds on piston 60 when valve 64 is opened, admitting air from regulator 63 into chamber 67 of cylinder 61. This produces full 25% compression of O-ring 26. If piston 60 has an active area of 10 square inches, then regulator 63 is adjusted to approximately 70 PSI. Low pressure regulator 65 is adjusted to a pressure that will produces a force of 200 pounds on piston 60 when valve 66 is opened, admitting air from regulator 65 into chamber 67. Adjustment of regulator 65 to about 20 PSI produces this force, which results in a 10% compression of O-ring 26.

Valve 68 is used to admit air to chamber 69 of cylinder 61 in order to retract seal plate 23 and permit passage of a substrate through aperture 22. The selection of valves 64, 66 or 68 is made though controller 70 which provides control functions equivalent to controller 54 of FIG. 6. It will be recognized that the objective of selectively controlling the force applied to seal plate 23 and thus the degree of compression of O-ring 26 can be achieved in other ways.

A sputtering system 10 according to principles of the present invention is preferably equipped to automatically determine and provide the required degree of seal compression for each individual port seal. For example, referring to FIG. 2, transfer chamber 11 can be provided with a vacuum sensing switch 76 and each of process chambers 16 or the loading chambers 14 can contain a vacuum sensing switch 75. Each of switches 75 or 76 is set to actuate at an absolute pressure level above any process pressure but below atmospheric pressure. A typical setting threshold is I Torr. Switches 75 and 76 preferrably provide signals to controllers 54 or 70 to control port seals 15 in the following manner:

If transfer chamber switch 76 is actuated, indicating a high pressure, all port seals 15 will operate in high (25%) compression mode.

If any of process or load chamber switches 75 is actuated, indicating a high pressure, the port seal 15 for that chamber will operate in high (25%) compression mode while the remaining port seals for chambers whose switches 75 are not actuated, indicating that those chambers are at low pressure, operate in low (10%) compression mode.

If none of switches 75 or 76 is actuated by high pressure, then all port seals operate in low (10%) compression mode.

From the above, it will be readily apparent to those skilled in the art that variations or additions may be made to the embodiments described above without departing from the principles of the present invention. Accordingly, what is claimed is:

1. A wafer processing apparatus comprising:
- a plurality of evacuatable chambers;
- a separating wall between adjacent ones of the chambers, the wall having an aperture therethrough;
- a sealing member adjacent the aperture and having an elastomeric seal, the sealing member being moveable away from the aperture to permit passage of a wafer through the aperture and moveable toward the aperture to engage the wall to seal the aperture;
- a sealing member actuator effective to move the sealing member to and from an open position away from the aperture and move the sealing member to and from each of at least two sealing positions at each of which the seal is compressed to a differing degree of compression against the wall around the aperture; and a sealing member position sensor that measures the distance between the sealing member actuator and the separating wall, said sensor generating a signal in relation to the distance of the sealing member actuator and said wall defining at least one of the two sealing positions at which the sealing member is compressed less than at another one of the sealing positions, the sealing member actuator moves the sealing member to and stops the sealing member in the at least one of the sealing positions in response to a signal from the sealing member position sensor.

2. The apparatus of claim 1 further comprising:

a controller operable to select one of said at least two sealing positions of said sealing member each defined by the pre-determined distances of said sealing member relative to the wall at the aperture; and the actuator being responsive to the controller to move the sealing member to a first sealing position at a first of the predetermined distance to compress the seal to a greater degree of compression, the first of the predetermined distance being selected by the controller when a greater pressure differential exists between the two adjacent chambers, and to a second sealing position at a second of the predetermined distance to compress the seal to a lesser degree of compression, the second of the predetermined distance being selected by the controller when a lesser pressure differential exists between the two adjacent chambers.

3. The apparatus of claim 1 further comprising:

a pressure sensor in each of the adjacent chambers;

a controller for selecting a sealing position in response to signals from the pressure sensor to cause the actuator to move the sealing member to the selected sealing position based on the pressures sensed.

4. A method of processing wafers comprising the steps of:

selectively moving a sealing member having an elastomeric seal thereon among selected ones of a plurality of sealing positions at which the seal is compressed to two different degrees of compression to seal a wafer transport aperture in a wall between two adjacent evacuatable chambers of a wafer processing apparatus, to seal the adjacent chambers from each other;

generating a signal that measures the distance between the sealing member and the wall the moving of the plurality of sealing member among the sealing positions including maintaining the sealing member at one of the sealing positions in response to the measured distance generated by signal and the selection of the one of the sealing positions; and moving the member away from the aperture and transferring a wafer through the opening.

5. The method of claim 4 wherein:

the moving step includes the step of selectively moving the member among positions defined by predetermined distances of said moving seal member relative to the wall at the opening.

6. The method of claim 4 further comprising the steps of:

sensing the pressure in each of the adjacent chambers; and moving the sealing member to a selected one of the sealing positions in response to the sensed pressure.

* * * * *

UNITED STATES PATENT AND TRADEMARK OFFICE

CERTIFICATE OF CORRECTION

PATENT NO. : 6,032,419
DATED : March 7, 2000
INVENTOR(S) : Hurwitt

It is certified that error appears in the above-identified patent and that said Letters Patent is hereby corrected as shown below:

Column 2, line 26 reads "seated" and should read--sealed--.

Column 2, line 27 reads "seat" and should read--seal--.

Column 3, line 65 reads "chamber II" and should read--chamber 11--.

Column 4, line 67 reads "T." and should read--T,--.

Column 6, line 35 reads "I Torr." and should read --1 Torr.--.

Signed and Sealed this

Twenty-second Day of May, 2001

*Attest:*

NICHOLAS P. GODICI

*Attesting Officer* *Acting Director of the United States Patent and Trademark Office*